US006833735B2

(12) United States Patent
Kumar et al.

(10) Patent No.: US 6,833,735 B2
(45) Date of Patent: Dec. 21, 2004

(54) SINGLE STAGE PULSED DOMINO CIRCUIT FOR DRIVING CASCADED SKEWED STATIC LOGIC CIRCUITS

(75) Inventors: Sudarshan Kumar, Freemont, CA (US); Jiann-Cherng Lan, San Jose, CA (US); Snehal Jariwala, Santa Clara, CA (US); Wenjie Jiang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/335,141

(22) Filed: Dec. 31, 2002

(65) Prior Publication Data

US 2004/0124882 A1 Jul. 1, 2004

(51) Int. Cl.[7] .............................................. H03K 19/096
(52) U.S. Cl. ............................. 326/95; 326/93; 326/98; 327/208
(58) Field of Search ............................. 326/93, 95, 98; 327/208–212, 214, 215, 224, 225

(56) References Cited

U.S. PATENT DOCUMENTS 6,275,071 B1 * 8/2001 Ye et al. ........................ 326/98
6,329,857 B1 * 12/2001 Fletcher ....................... 327/215
6,496,038 B1 * 12/2002 Sprague et al. ............... 326/95

* cited by examiner

Primary Examiner—Vibol Tan
(74) Attorney, Agent, or Firm—Blakely, Sokoloff, Taylor & Zafman LLP

(57) ABSTRACT

A complementary metal oxide semiconductor (CMOS) low-power, high speed logic circuit consisting of a cascaded chain of stages. The first stage is a pulsed domino logic circuit having one or more logic signal inputs for receiving data signals, and a timing input for receiving a clocking pulse that conditions the input pulse domino stage for evaluation during a brief window of time. The output of the pulsed domino circuit is connected to a chain of series-connected skewed static logic gates, each having the channel sizes of its pull-up and pull-down transistors ratioed to a produce, from gate-to-gate in the static logic chain, alternating fast high-to-low and low-to-high transitions for the information carrying leading edge of said input data signals. The use of a pulsed domino first stage driving a chain of skewed logic static gates reduces power consumption but retains the speed of conventional domino logic circuits.

14 Claims, 2 Drawing Sheets

US 6,833,735 B2

SINGLE STAGE PULSED DOMINO CIRCUIT FOR DRIVING CASCADED SKEWED STATIC LOGIC CIRCUITS

FIELD OF THE INVENTION

This invention relates to digital logic devices implemented using CMOS integrated circuits.

BACKGROUND OF THE INVENTION

Complex logical functions are commonly performed using chains of integrated circuit logic gates.

Static CMOS (complementary metal oxide semiconductor) logic gates employ a combination of one or more a p-type metal oxide semiconductor (PMOS) devices interconnected with one or more n-type metal oxide semiconductor (NMOS) devices to implement a desired logic function. The junction of the PMOS and NMOS transistors forms the output node for the gate.

Dynamic CMOS logic circuitry typically consists of a cascaded chain of logic stages, each consisting of NMOS logic connected to an output node which is precharged by one or more PMOS devices which are switched ON by an input clock signal. When the clock signal is inactive, the output node is selectively discharged by the NMOS devices which are controlled by the input signal values. In this arrangement, input signals applied to the first stage of the chain trigger the operation of the remaining stages in sequence, yielding a signal propagation effect akin to a line of falling dominos, and dynamic logic circuits are hence also called "domino logic" circuits.

Domino logic increase the speed at which the information bearing signals can propagate through the circuit by pre-charging the gates during the first clock phase and evaluating the inputs during the second clock phase. However, domino logic consumes more power than static logic because the domino output precharges during every precharge phase and discharges during every evaluation phase in which the inputs evaluate to a discharged state.

Examples of CMOS domino logic circuits are described in U.S. Pat. Nos. 4,700,086, 5,369,621; 5,821,775; 6,275,071. Arrangements for increasing the speed of domino logic circuits are disclosed in U.S. Pat. Nos. 5,121,003; 5,208,490; 5,343,090; 5,661,675 and 5,796,282. Methods and apparatus for reducing the power consumption of domino logic circuits are disclosed in U.S. Pat. Nos. 5,880,968; 5,880,986; and 6,005,417.

A second family of devices called "skewed logic gates" may also be used to increase the speed of signal propagation through a chain of gates. Skewed circuits are CMOS devices in which the sizes of the PMOS and NMOS transistors are adjusted to enable one of the transitions to be faster than the other. By changing the altering the drive characteristic of the PMOS and NMOS networks, performance comparable to dynamic circuits may be achieved while at the same time reducing clock power consumption. As described in U.S. Pat. No. 6,154,045, by alternately skewing gates in a chain of gates for fast rise and fast fall, the total signal delay through the chain of gates is reduced as compared to the delay experienced by a signal transmitted through a chain of similar gates that are not skewed (i.e. "balanced" gates that have the sizes of the p-type and n-type gates ratioed for substantially equal rise and fall times).

The embodiment of the invention described below takes the form of a chain of logic gates comprising a first pulsed domino logic stage followed by a series of skewed static gates. The domino logic first stage receives a clocking pulse that preconditions the input for evaluation only during a brief window of time determined by an input pulse. The pulsed domino logic gate is followed by a sequence of skewed static gates which provide the speed of domino circuits at reduced power.

The use of a single stage pulsed domino circuit reduces power consumption by replacing all but the first stage of the domino logic chain with skewed logic gates and by substituting a pulsed domino stage for the conventional clocked domino circuit. This arrangement significantly reduces the load on the clock, provides better tolerance to cross-coupling and noise, and proves better $V_{cc}/V_t$ scaling than conventional domino logic chains.

These and other features and advantages may be better understood by considering the following detailed description of a preferred embodiment of the invention. In the course of this description, frequent reference will be made to the attached drawings.

DETAILED DESCRIPTION

Figure 1:
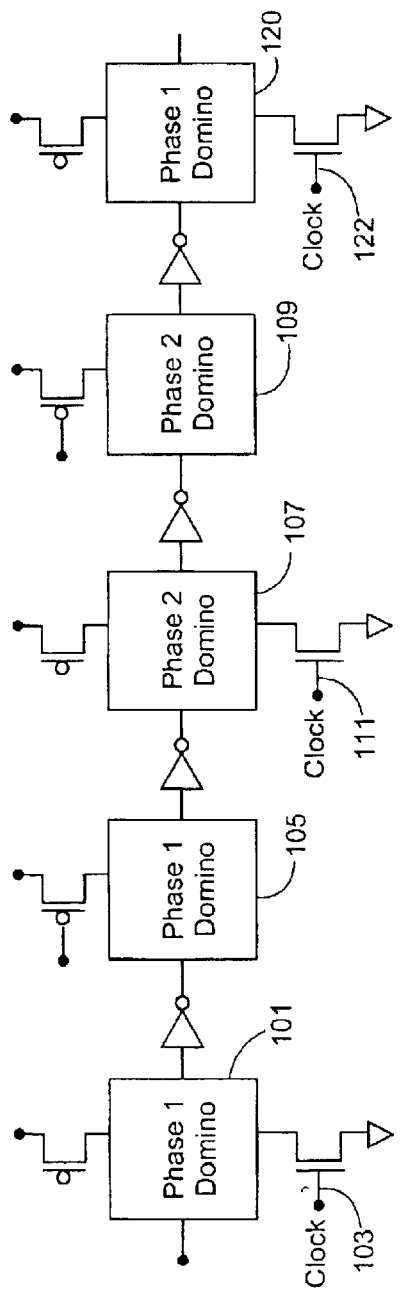
FIG. 1 is a block diagram of a conventional, prior art domino logic chain.

A conventional single rail domino (SRD) logic chain uses two-phase clocking in which the precharge and evaluation of adjacent blocks of logic occurs on alternate phases. As shown in FIG. 1, the first (D1) domino circuit 101 and the second (D2) domino circuit 103 are clocked at 105 with a phase 1 clocking signal. The second D1D2 chain of domino circuits 107 and 109 are clocked at 111 with the alternate phase 2 clock. A high skewed CMOS inverter is connected to the output of each domino gate in the chain. The chain of D1D2 pairs may be continued as illustrated by the D1 stage seen at 120 which is clocked with a phase 1 clock at 122.

Figure 2:
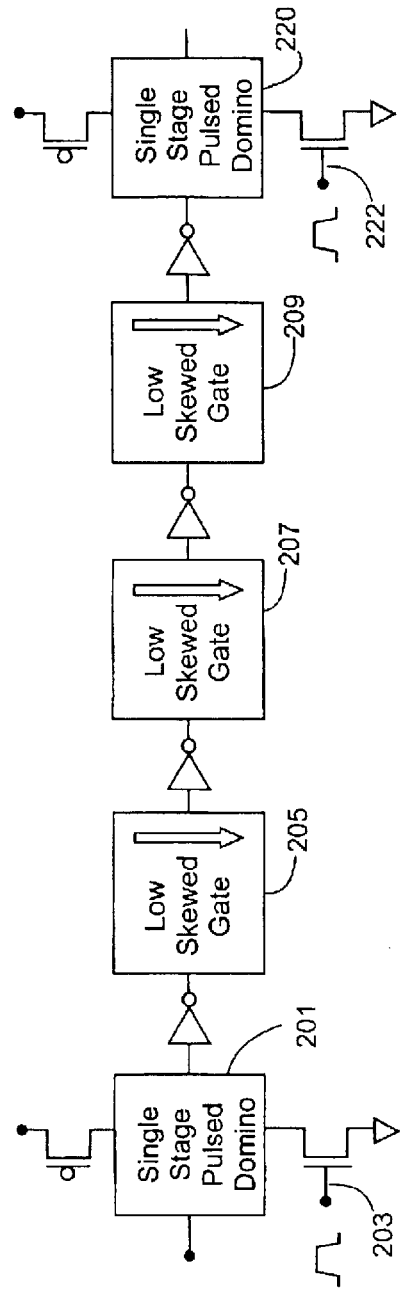
FIG. 2 is a block diagram of a single stage pulsed domino logic chain that embodies the invention.

The single stage pulsed domino circuit embodying the present invention is shown in FIG. 2 for comparison. The first domino stage 101 seen in FIG. 2 is replaced with a single stage pulsed domino circuit 201 which is pulse clocked at 203. The domino logic stages 102, 107 and 109 are replaced with corresponding low skewed static logic gates at 205, 207, and 209 respectively. The output of gate 209 may be connected to a single stage pulsed domino circuit 220 which is pulse clocked at 222 to drive a further sequence of skewed static logic gates (not shown).

Figure 3:
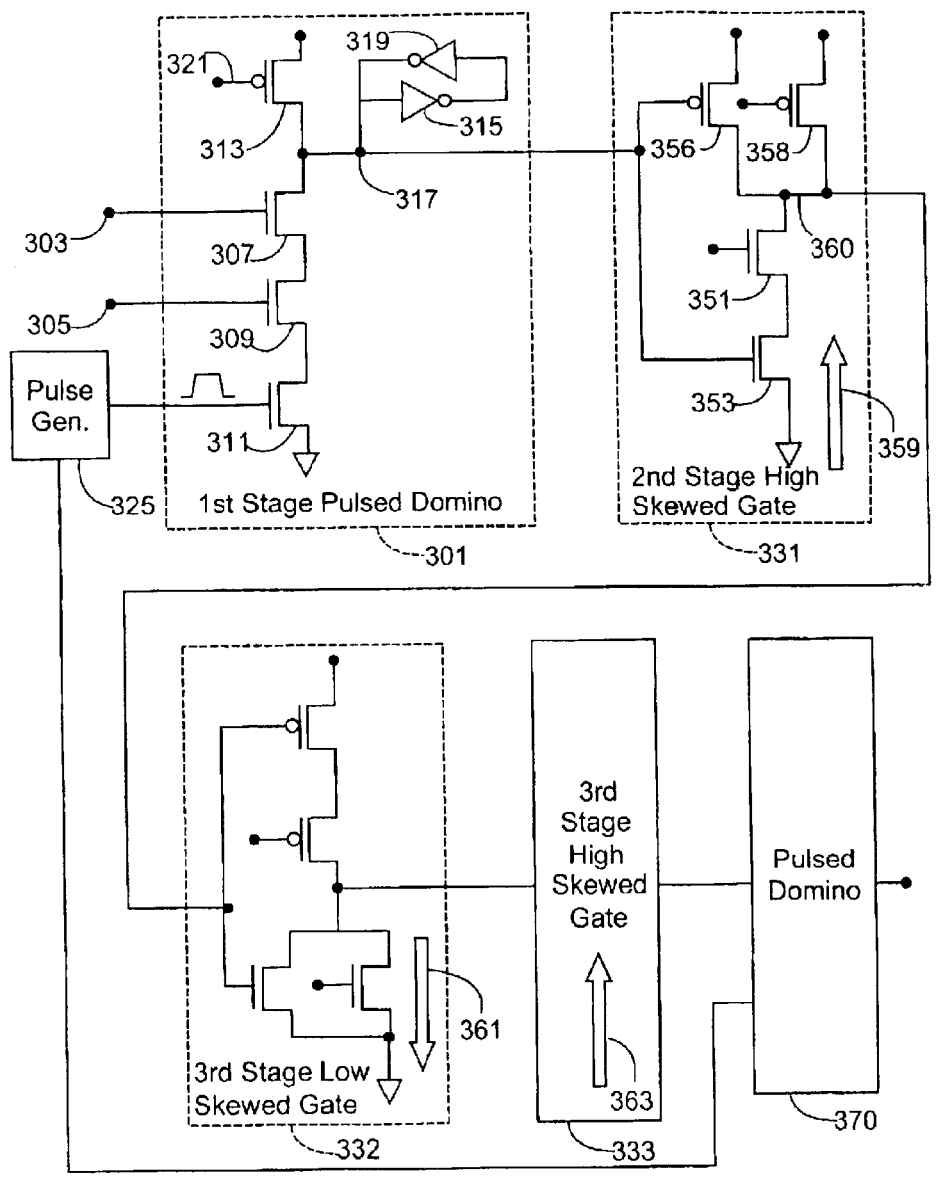
FIG. 3 is a gate level diagram of an illustrative single stage pulsed domino logic circuit.

An illustrative circuit embodying the invention is shown in FIG. 3.

The first stage 301 is an illustrative pulsed domino circuit with two logic inputs 303 and 305 connected to NMOS transistors 307 and 309 respectively. The NMOS devices 307 and 309 are connected in series with an NMOS evaluation transistor 311. FIG. 3 shows inputs to the domino evaluation network, but it is to be understood that the single stage pulsed domino circuit may have number of inputs, one or more of which may be the output of static logic blocks. The pulsed domino gate 301 further includes a PMOS precharge transistor 313 and keeper circuit comprising an inverter 315 whose input is connected to the output node 317 of the domino circuit, the output of inverter 315 being connected to the input of a second inverter 319 whose output is connected back to the domino output node 317. The PMOS precharge transistor 313 pulls output node 317 high during the precharge phase, while the 50% duty cycle clock signal applied at 321 is low. The NMOS evaluation transistors 307 and 309 operate only when the NMOS evaluation transistor is ON and the pulse output from the pulse generator 325 is high. The width of the pulse from the generator is greater than the maximum required evaluation time of the evaluation transistors 307 and 309, to make certain that the output of the domino evaluation tree at 317 is valid. In one embodiment, the clock pulse has a width greater than the required time duration required to evaluate signals applied to the logic signal inputs. The width of pulse from the source 325 is less than the minimum time required for a change in any input to fully propagate to the domino inputs. For additional information on pulsed domino logic circuits, see U.S. Pat. No. 5,880,608 entitled "Pulsed domino latches" issued on Mar. 9, 1999 to Mehta, et al. and assigned to Intel Corporation, the disclosure of which is incorporated herein by reference.

In the illustrative embodiment shown in FIG. 3, the output of the single stage pulsed domino circuit 301 is connected to a chain of three skewed static gates 331, 332 and 333. A skewed logic gate has the same circuit topology as a conventional static CMOS gate but the relative sizes of the PMOS and NMOS transistors in the pull-up and pull-down networks are altered to provide either fast low-to-high or high-to-low transitions. Thus, in the logic gate 331, the sizes of the NMOS transistors 351 and 352 in the evaluation network may be decreased while the sized of the PMOS transistors 356 and 358 are increased, providing a fast low-to-high transition at the output node 360 of the gate 331 as indicated by the upwardly directed arrow 359. The ratio of the PMOS and NMOS sizes may be changed without changing the overall transistor width and gate capacitance.

As illustrated by the arrows 359, 361 and 363, the static gates 331, 332 and 333 are alternately skewed. Alternating skewed static logic achieves performance comparable to that of domino logic circuits. During the precharge phase, all of the gates are reset to their initial states through their respective "slow" transitions. During evaluation, only fast transitions occur in the connected gates. To permit this, a gate skewed for fast low-to-high transitions (e.g. gate 331) should be followed by a gate skewed for fast high-to-low transitions (e.g. gate 332). Additional information describing the design of skewed CMOS logic may is presented in "Skewed CMOS: Noise-Immune High Performance Low Power Static Circuit Family," by A. Solomatnikov, D. Somasekhar, K. Roy and C. K. Koh; 2000 *IEEE International Conference on Computer Design: VLSI in Computers & Processors*, pp. 241–246, IEEE paper 0-7695-0801-4/00 (September 2000).

The chain of three skewed logic gates 331, 332 and 333 illustrated in FIG. 3 drives a further single stage pulsed domino circuit 370 of the kind illustrated at 301. Note that the pulsed domino logic may be directly connected to receive the outputs one or more skewed static gates as described.

The single stage pulsed domino (SSPD) technique that has been described uses one domino gate followed by a series of skewed static gates to provide the speed of conventional domino chains with lower power consumption. The first domino stage preconditions the input and the following stages, speeding the propagation of the evaluation transition from the input domino gate along the chain of skewed gates. By converting a conventional domino gate chain used on paths critical to performance to the SSPD configuration, high performance can be retained while reducing the load on the system clock and avoiding the need to generate special clock signals for the two phase domino chain. In addition, the use of the pulsed domino first stage avoids the precharge device on the first stage, further reducing power consumption. Note that both conventional skewed logic chains may be converted in the same way, replacing the storage element on the first stage with a pulsed domino circuit.

It is to be understood that the embodiment of the invention which has been described is merely one illustrative application of the principles of the invention. Numerous modifications may be made to the circuits described without departing from the true spirit and scope of the invention.

What is claimed is:

1. A complementary metal oxide semiconductor (CMOS) low-power high speed logic circuit for processing input data signals that change at pre-defined times, said logic circuit comprising a chain of logic gates comprising:

a pulsed domino logic first stage having one or more logic signal inputs for processing selected ones of said input data signals, a logic output, and a timing input for receiving a clocking pulse, said clocking pulse conditioning said logic signal inputs for evaluation; and a sequence of series-connected skewed static logic gates connected to said logic output of said pulsed domino logic first stage, each of said skewed static logic gates having a first logic input connected to the preceding logic gate in said chain and having zero or more additional logic inputs for processing selected ones of said input data signals, wherein said sequence of series-connected skewed static logic gates exhibit alternating fast rise and fast fall times from gate to gate in said sequence.

2. The logic circuit as set forth in claim 1 wherein each of said skewed static logic gates employs at least one pull up transistor and at least one pull-down transistor having channel sizes ratioed to a produce, from gate-to-gate in said, chain the alternating fast high-to-low and low-to-high transitions for the information carrying leading edge of said input data signals.

3. The dynamic CMOS logic circuit as set forth in claim 1 wherein said timing input of said pulsed domino logic first stage receives a clock pulse from an external clock pulse generator.

4. The dynamic CMOS logic circuit as set forth in claim 3 wherein said clock pulse has a width greater than a time duration required to evaluate signals applied to said logic signal inputs.

5. A dynamic CMOS logic circuit comprising:

a pulsed domino logic input circuit having one or more logic signal inputs and a logic output, and a cascaded chain of alternately skewed static logic gates each having one or more logic inputs and a logic output, one of the logic inputs of the first of said static logic gates in said chain being connected to the logic output of said domino logic input circuit, and the remaining ones of said static logic gates in said chain having one of its logic inputs connected to the logic output of the preceding static logic gate in said chain.

6. The dynamic CMOS logic circuit as set forth in claim 5 wherein said pulsed domino logic input circuit includes a clock pulse input for receiving a clock pulse from an external clock pulse generator.

7. The dynamic CMOS logic circuit as set forth in claim 5 wherein said clock pulse has a width greater than a time duration required to evaluate signals applied to said logic signal inputs.

8. A dynamic complementary metal oxide semiconductor (CMOS) low-power high speed logic circuit for processing input data signals that change at pre-defined times, said logic circuit comprising a cascaded chain of stages, each of which has at least one logic input and a logic output, said chain of stages comprising:

a pulsed domino logic first stage having a timing input to receive a clock pulse, a skewed static logic gate second stage having one logic input connected to the logic output of said pulsed domino logic first stage, a skewed static logic gate third stage having one logic input connected to the logic output of said skewed static logic gate second stage, and a skewed static logic gate fourth stage having one logic input connected to the logic output of said skewed static logic gate third stage, wherein said skewed static logic gate second, third and fourth stages exhibit alternating fast rise and fast fall times.

9. The dynamic CMOS logic circuit as set forth in claim 8 wherein the clock pulse has a width greater than a time duration required to evaluate signals applied to said logic signal inputs.

10. The logic circuit as set forth in claim 8 wherein each of said stages employs at least one pull up transistor and at least one pull-down transistor having channel sizes ratioed to a produce, from gate-to-gate, the alternating fast high-to-low and low-to-high transitions for the information carrying leading edge of logic signals applied to said logic inputs.

11. A dynamic CMOS logic circuit comprising:

a pulsed domino logic input circuit having one or more logic signal inputs and a logic output, and a cascaded chain of skewed static logic gates each having one or more logic inputs and a logic output, one of the logic inputs of the first of said static logic gates in said chain being connected to the logic output of said domino logic input circuit, and the remaining ones of said static logic gates in said chain having one of its logic inputs connected to the logic output of the preceding static logic gate in said chain, wherein said cascaded chain of skewed static logic gates exhibit alternating fast rise and fast fall times from gate to gate in said chain.

12. A dynamic CMOS logic circuit comprising:

a pulsed domino logic input circuit having one or more logic signal inputs and a logic output, and a cascaded chain of skewed static logic gates each having one or more logic inputs and a logic output, one of the logic inputs of the first of said static logic gates in said chain being connected to the logic output of said domino logic input circuit, and the remaining ones of said static logic gates in said chain having one of its logic inputs connected to the logic output of the preceding static logic gate in said chain, wherein said cascaded chain of skewed logic gates comprise cascaded pairs of stages, the first stage in each pair being a static logic gate having one or more logic signal inputs and a gate output, and the second stage being an inverter, each of said pairs of stages comprises one stage having a fast rise time and another stage having a fast fall time.

13. A dynamic complementary metal oxide semiconductor (CMOS) low-power high speed logic circuit for processing input data signals that change at pre-defined times, said logic circuit comprising a cascaded chain of stages, each of which has at least one logic input and a logic output, said chain of stages comprising:

a pulsed domino logic first stage having a timing input to receive a clock pulse, a skewed static logic gate second stage having one logic input connected to the logic output of said pulsed domino logic first stage, a skewed static logic gate third stage having one logic input connected to the logic output of said skewed static logic gate second stage, a skewed static logic gate fourth stage having one logic input connected to the logic output of said skewed static logic gate third stage, and an inverter connected in series with the logic output of each of said stages in said chain of stages.

14. A dynamic complementary metal oxide semiconductor (CMOS) low-power high speed logic circuit for processing input data signals that change at pre-defined times, said logic circuit comprising a cascaded chain of stages, each of which has at least one logic input and a logic output, said chain of stages comprising:

a pulsed domino logic first stage having a timing input to receive a clock pulse, a skewed static logic gate second stage having one logic input connected to the logic output of said pulsed domino logic first stage, a skewed static logic gate third stage having one logic input connected to the logic output of said skewed static logic gate second stage, and a skewed static logic gate fourth stage having one logic input connected to the logic output of said skewed static logic gate third stage, wherein each of said stages comprises the cascaded combination of a logic gate and an inverter having alternating fast rise times and fast fall times.

\* \* \* \* \*

UNITED STATES PATENT AND TRADEMARK OFFICE
CERTIFICATE OF CORRECTION

PATENT NO. : 6,833,735 B2
DATED : December 21, 2004
INVENTOR(S) : Kumar et al.

It is certified that error appears in the above-identified patent and that said Letters Patent is hereby corrected as shown below:

Column 4,
Lines 37-38, delete "said,chain" and insert -- said chain, --.

Signed and Sealed this

Thirty-first Day of May, 2005

JON W. DUDAS
*Director of the United States Patent and Trademark Office*